US012702056B1

(12) United States Patent
Bond et al.

(10) Patent No.: US 12,702,056 B1
(45) Date of Patent: Aug. 4, 2026

(54) FLANGED STIFFENER RING

(71) Applicant: Marvell Asia Pte Ltd, Singapore (SG)

(72) Inventors: David M. Bond, Apex, NC (US);
Richard S Graf, Gray, ME (US);
Janak Patel, South Burlington, VT
(US)

(73) Assignee: Marvell Asia Pte Ltd, Singapore (SG)

( * ) Notice: Subject to any disclaimer, the term of this
patent is extended or adjusted under 35
U.S.C. 154(b) by 531 days.

(21) Appl. No.: 18/301,306

(22) Filed: Apr. 17, 2023

Related U.S. Application Data

(60) Provisional application No. 63/331,900, filed on Apr.
18, 2022.

(51) Int. Cl.
*H10W 76/40* (2026.01)
*H10W 40/10* (2026.01)
*H10W 72/00* (2026.01)
*H10W 76/01* (2026.01)
*H10W 90/00* (2026.01)

(52) U.S. Cl.
CPC ........... *H10W 76/40* (2026.01); *H10W 40/10*
(2026.01); *H10W 76/01* (2026.01); *H10W*
*72/877* (2026.01); *H10W 90/724* (2026.01);
*H10W 90/731* (2026.01)

(58) Field of Classification Search
CPC ....................................................... H01L 23/16
See application file for complete search history.

(56) References Cited

U.S. PATENT DOCUMENTS

| | | | | |
|---|---|---|---|---|
| 5,969,947 | A | 10/1999 | Johnson et al. | |
| 6,775,140 | B2 * | 8/2004 | Shim ..................... | H10W 40/10 |
| | | | | 257/E23.101 |
| 8,232,138 | B2 * | 7/2012 | Lim ........................ | H10W 76/40 |
| | | | | 257/688 |
| 8,927,344 | B2 * | 1/2015 | Topacio .............. | H10W 74/117 |
| | | | | 438/126 |
| 8,986,806 | B1 * | 3/2015 | Baloglu .............. | H10W 42/121 |
| | | | | 428/81 |
| 9,275,876 | B2 * | 3/2016 | Kim .................... | H10W 72/071 |
| 10,643,913 | B2 * | 5/2020 | Kwon ................. | H10W 42/121 |
| 10,840,192 | B1 * | 11/2020 | Zohni ................. | H10W 42/121 |
| 11,246,211 | B1 * | 2/2022 | Refai-Ahmed ....... | H05K 1/0272 |
| 11,587,887 | B2 * | 2/2023 | Lin ........................ | H10W 40/10 |
| 11,830,859 | B2 * | 11/2023 | Wang .................. | H10W 42/121 |
| 12,315,768 | B2 * | 5/2025 | Lin ........................ | H10W 40/22 |

(Continued)

FOREIGN PATENT DOCUMENTS

JP       2010182855 A       8/2010

OTHER PUBLICATIONS

Marvell, "COLORZ® 100G DWDM Optical Platform for Data
Center Interconnects," Product Brief, pp. 1-1, year 2021.

(Continued)

*Primary Examiner* — Dale E Page
*Assistant Examiner* — Rohit Parthasarathy
(74) *Attorney, Agent, or Firm* — Meitar Patents Ltd.;
Daniel Kligler

(57) ABSTRACT

A flanged stiffener ring for device packages/electronic
devices includes flanges protruding from the sides of the
stiffener ring body. The flanged stiffener ring is of minimal
material to keep weight low, but maintain rigidity and, thus
provide stiffening forces to a substrate of the device package
to inhibit substrate warpage.

15 Claims, 7 Drawing Sheets

(56) References Cited

U.S. PATENT DOCUMENTS

| | | | |
|---|---|---|---|
| 2002/0039807 A1 | 4/2002 | Koyama | |
| 2002/0114144 A1* | 8/2002 | Kumamoto | H10W 74/111 |
| | | | 257/E21.503 |
| 2005/0199998 A1* | 9/2005 | Chen | H10W 76/40 |
| | | | 257/706 |
| 2008/0054490 A1* | 3/2008 | McLellan | H10W 74/012 |
| | | | 257/E21.503 |
| 2008/0280474 A1* | 11/2008 | Fan | H05K 7/1061 |
| | | | 257/E23.086 |
| 2009/0057920 A1 | 3/2009 | Dedic et al. | |
| 2009/0200659 A1* | 8/2009 | Tosaya | H10W 76/40 |
| | | | 257/E23.181 |
| 2010/0117200 A1* | 5/2010 | Jung | H10W 70/68 |
| | | | 257/E23.005 |
| 2015/0001701 A1* | 1/2015 | Li | H05K 1/0204 |
| | | | 257/713 |
| 2016/0073493 A1* | 3/2016 | Leung | H05K 1/0271 |
| | | | 174/250 |
| 2019/0115269 A1* | 4/2019 | Pan | H10W 42/121 |
| 2019/0390926 A1 | 12/2019 | Koyano et al. | |
| 2020/0051894 A1 | 2/2020 | Wan et al. | |
| 2020/0105640 A1* | 4/2020 | Chiu | H10W 40/60 |
| 2020/0152546 A1* | 5/2020 | Refai-Ahmed | H10W 40/611 |
| 2020/0258807 A1* | 8/2020 | Kao | H10W 40/22 |
| 2021/0366841 A1* | 11/2021 | Iyengar | H10W 40/47 |
| 2022/0359322 A1* | 11/2022 | Hung | H10W 40/22 |
| 2023/0018343 A1* | 1/2023 | Lin | H10W 40/22 |
| 2023/0018359 A1* | 1/2023 | Tsai | H10W 40/22 |
| 2023/0063270 A1 | 3/2023 | Lee et al. | |
| 2023/0282547 A1* | 9/2023 | Refai-Ahmed | H10W 40/73 |
| | | | 257/715 |

OTHER PUBLICATIONS

Dow Corning, "Semiconductor Packaging Materials Selection Guide," pp. 1-8, year 2016.

Dow Corning, "Dow Corning® SE 4450 Thermally Conductive Adhesive," Product Information, pp. 1-3, year 2008.

Graf et al., U.S. Appl. No. 18/190,163, filed Mar. 27, 2023.

Patel et al., U.S. Appl. No. 18/177,136, filed March 2, 202323.

Ajinomoto Co., Inc., "Ajinomoto Build-up Film," pp. 1-17, years 2019-2023.

ShinEtsu Microsi, "Thermal Interface Material X23-7772-4," Technical Data Sheet, pp. 1-2, year 2011, as downloaded from https://j6i3r2y3.stackpathcdn.com/wp-content/uploads/2015/06/DS-20X-23-7772-4.pdf.

Henkel Corporation, "Loctite Ablestik 965-1L," Technical Data Sheet, pp. 1-2, Oct. 2014.

Pan et al., "Comparing Techniques for Temperature-Dependent Warpage Measurement," Global SMT & Packaging, pp. 14-18, Feb. 2008.

Cooler Master Technology Inc., "MasterGel Pro V2 High Thermal Conductivity Compound," p. 1, Apr. 9, 2020, as downloaded from https://www.coolermaster.com/catalog/coolers/thermal-grease/mastergel-pro-v2/.

Mathweb, "Master Bond EP5TC-80 One component thermally conductive, electrically insulating epoxy", pp. 1-2, years 1996-2023, as downloaded from https://www.matweb.com/search/datasheet.aspx?matguid=f13765d1206f4ef0b57875be71583e23&ckck=1.

Mathweb, "Master Bond EP3HTS-TC One component, silver filled epoxy", pp. 1-2, years 1996-2023, as downloaded from https://www.matweb.com/search/datasheet.aspx?matguid=dc973bc6e7344138a23423672ea632d8.

Patel et al., U.S. Appl. No. 18/343,769, filed Jun. 29, 2023.

Wang et al., U.S. Appl. No. 18/446,511, filed Aug. 9, 2023.

Notice of References cited, U.S. Appl. No. 18/190,163, dated Feb. 4, 2026.

Non Final Office Action, U.S. Appl. No. 18/190,163, dated Feb. 4, 2026.

* cited by examiner

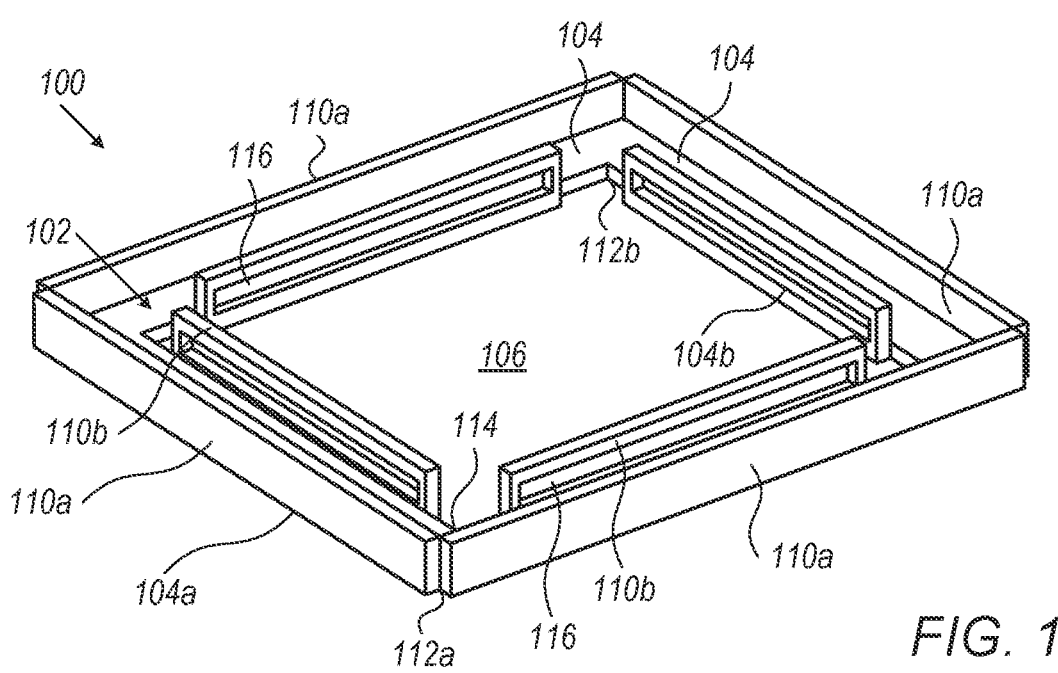
*FIG. 1*
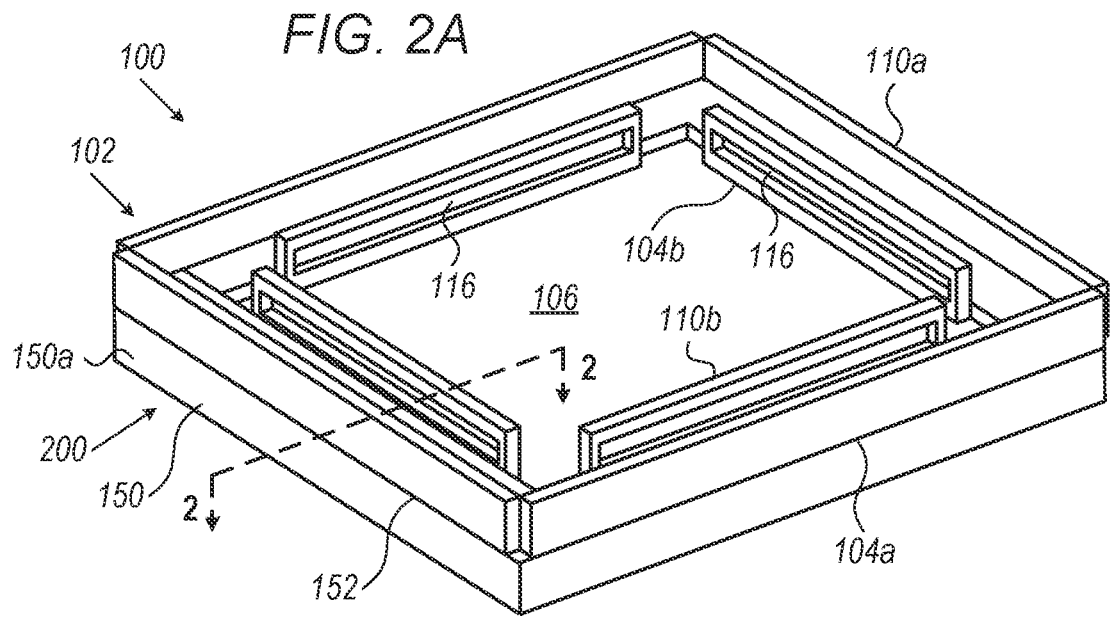
*FIG. 2A*
*FIG. 2B*
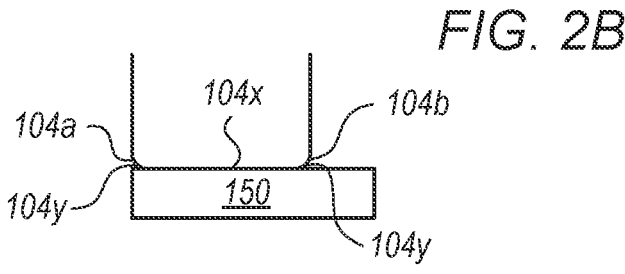

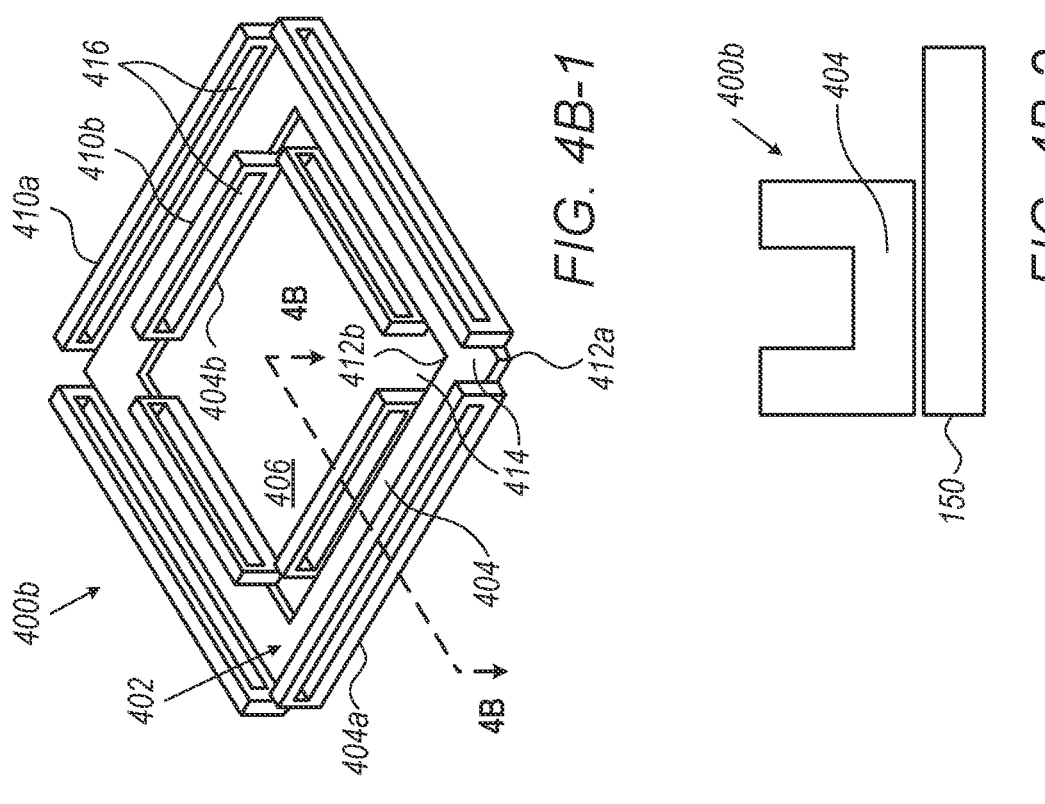
*FIG. 4B-1*
*FIG. 4B-2*
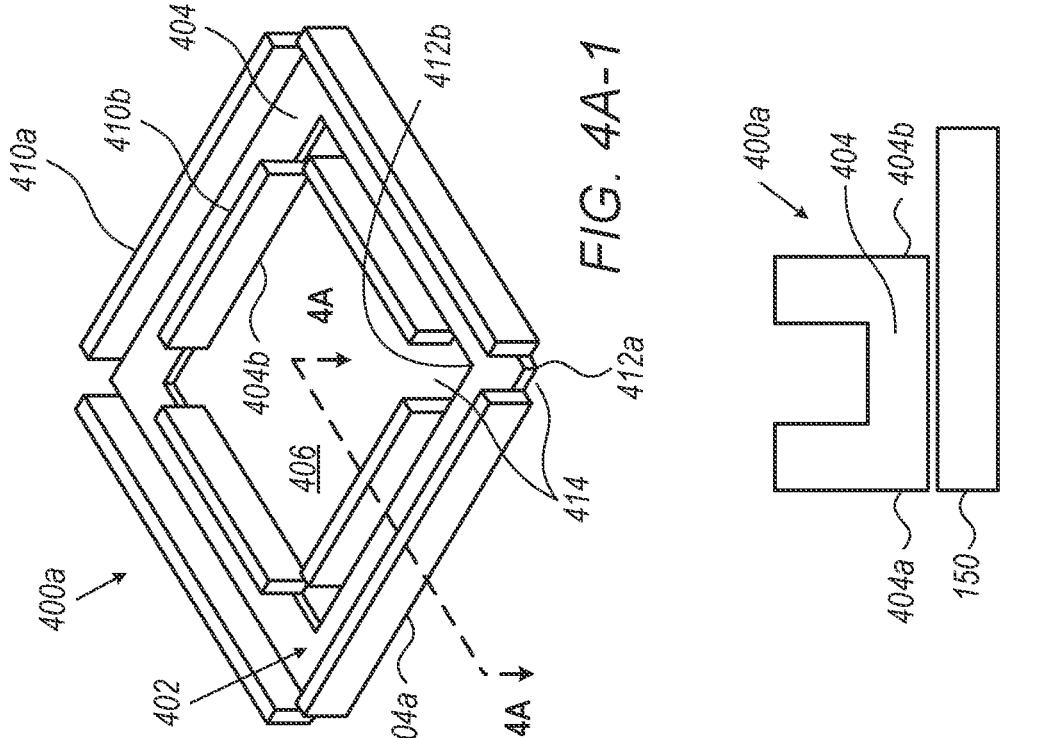
*FIG. 4A-1*
*FIG. 4A-2*

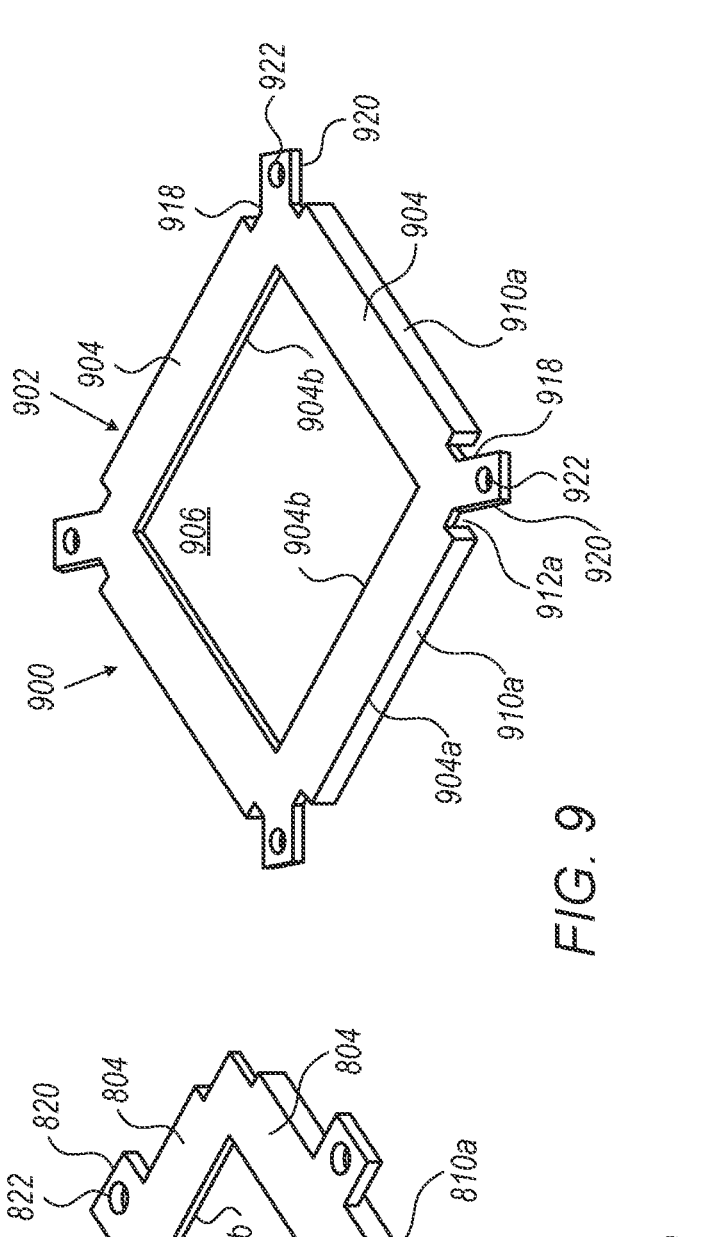
*FIG. 9*
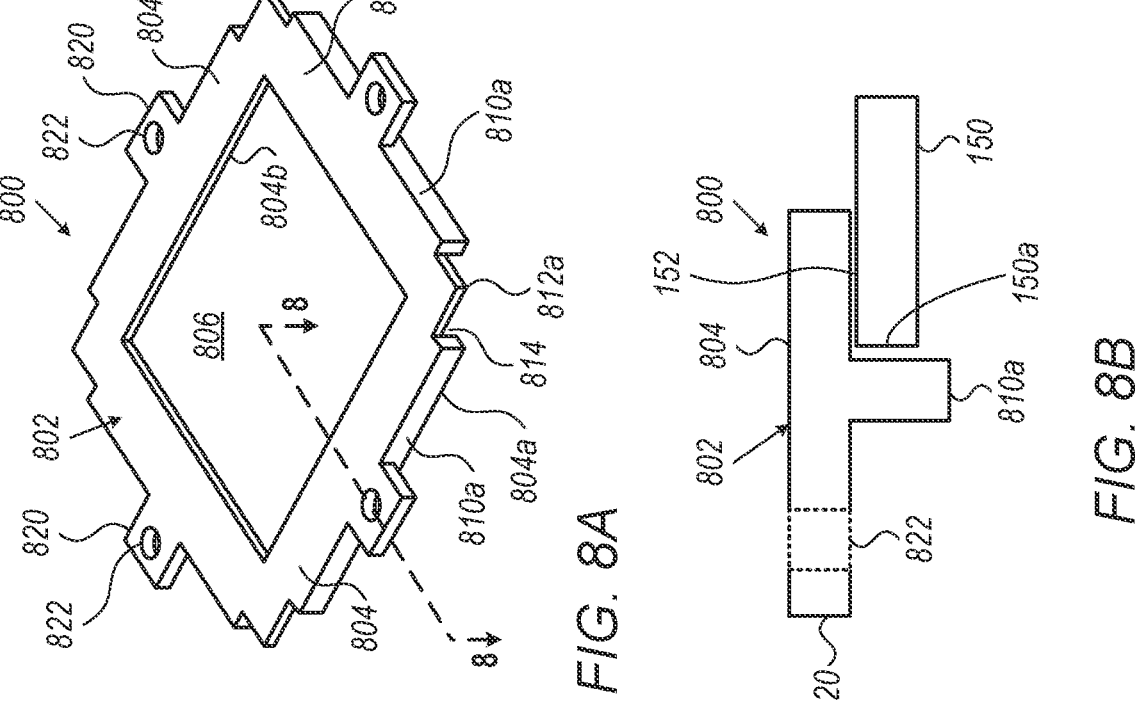
*FIG. 8A*
*FIG. 8B*

FLANGED STIFFENER RING

CROSS-REFERENCE TO RELATED APPLICATIONS

This application is related to and claims priority from commonly owned U.S. Provisional Patent Application, Ser. No. 63/331,900, entitled: Flanged Stiffener Ring, filed on Apr. 18, 2022, the disclosure of which is incorporated by reference in its entirety herein.

FIELD OF THE DISCLOSURE

The present disclosure relates generally to device packages, and particularly to warpage prevention in device packages.

BACKGROUND OF THE DISCLOSURE

Device packages including various Ball Grid Array (BGA) variants, such as Flip Chip Ball Grid Array (FC-PBGA) packages, continue to get larger in size, to accommodate large dies. These larger dies are a result of increased functionality, bandwidth, and speed for the device packages. Large die and large package size provide superior electrical performance for overall system on chip integration. However, as die size increases, there also comes an increased likelihood of mechanical warpage, which can cause die failures and manufacturing yield issues.

Warpage may be inhibited by using mechanical stiffeners, such as bars on the substrate and fully enclosed lids (of fully lidded packages) joined to the substrate, of the device package, which are used to maintain coplanarity. However, these stiffeners typically have a large foot, and thus, a corresponding large footprint, which occupies significant real estate on the substrate and can limit the quantity of chips, dies, devices and the like which can be packaged thereon.

SUMMARY OF THE DISCLOSURE

The present disclosure provides an electronic device, which comprises: a substrate; electronic components disposed on the substrate; and, a stiffener. The stiffener comprises: a ring body of a plurality of sides, each side extending between an outer edge and an inner edge, the inner edges forming an aperture in the ring body, the body configured to align with a perimeter of the substrate, and, at least one flange protruding from at least one side of the ring body, the at least one flange extending along at least part of the at least one side.

Optionally, the electronic device is such that, the ring body and the at least one flange are formed from a single blank.

Optionally, the electronic device is such that, wherein the single blank is of metal or of a composite material.

Optionally, the electronic device is such that, the metal includes copper or stainless steel.

Optionally, the electronic device is such that, the ring body formed by the plurality of the sides is rectangular in shape.

Optionally, the electronic device is such that, each side of the plurality of sides of the ring body is C-shaped in cross section.

Optionally, the electronic device is such that, the at least one flange protruding from the at least one side of the ring body protrudes from at least one of the outer edge or the inner edge.

Optionally, the electronic device is such that, the at least one flange includes a plurality of flanges, a first flange protruding from the outer edge and a second flange protruding from the inner edge.

Optionally, the electronic device is such that, the at least one flange includes a plurality of flanges, a first flange protruding from the outer edge in a first direction and a second flange protruding from the inner edge in a second direction, different from the first direction.

Optionally, the electronic device is such that, the first direction is opposite the second direction.

Optionally, the electronic device is such that, the at least one flange includes a flange protruding in a direction away from the substrate.

Optionally, the electronic device is such that, the at least one flange includes a flange protruding toward the substrate and bordering a side of the substrate.

Optionally, the electronic device is such that, the at least one flange has one or more openings formed therein.

Optionally, the electronic device is such that, the ring body includes tabs for receiving at least one fastener, the tabs positioned: 1) along at least two oppositely disposed sides of the ring body, or 2) at least at oppositely disposed corners of the ring body.

Optionally, the electronic device is such that it additionally comprises: a heat sink for attaching to the ring body via each of the at least one fastener.

Optionally, the electronic device is such that, each of the at least one fastener include a spring-based segment.

The present disclosure provides a method for inhibiting warpage in an electronic device. The method comprises: providing an electronic device comprising: a substrate; and, at least one electronic component disposed on the package substrate; and, providing a stiffener ring, comprising: a ring body of a plurality of sides, each side extending between an outer edge and an inner edge, the inner edges forming an aperture in the ring body, the body configured to align with a perimeter of the substrate, and, at least one flange protruding from at least one side of the ring body, the at least one flange extending along at least part of the at least one side. The stiffener ring is positioned on the substrate for mechanically supporting the substrate, and providing counterbalancing forces to the substrate.

Optionally, the method is such that the stiffener ring is positioned along the perimeter of the substrate.

Optionally, the method is such that, the stiffener ring is positioned on the substrate such that the aperture is substantially concentric with the substrate.

The present disclosure provides a method for making a stiffener ring for a substrate. The method comprises: obtaining a rectangular blank of material; removing angled portions from each outer corner of the blank, to form outer regions; removing a substantially central portion of the blank to define an aperture of the stiffener ring in the blank; removing substantially rectangular portions from the corners of the blank formed by the aperture, to form inner regions; wherein a body region is intermediate each respective outer and inner region, each body region from which a body of the stiffener ring is formed; and, bending the outer regions and the inner regions so that the outer regions and inner regions protrude (e.g., extend) from the body region substantially perpendicular to the body region, the protruding inner regions and the protruding outer regions forming flanges which extend in: 1) the same direction, or 2) different directions.

BRIEF DESCRIPTION OF THE DRAWINGS

Non-limiting examples of embodiments are described below with reference to figures attached hereto that are listed following this paragraph. Identical structures, elements or parts that appear in more than one figure are generally labeled with a same numeral throughout all figures in which they appear. Dimensions of components and features shown in the figures are chosen for convenience and clarity of presentation and are not necessarily shown to scale.

In the drawings:

FIG. 1 is a top perspective view of a flanged stiffener ring in accordance with an embodiment described herein;

FIG. 2A is a top perspective view of a device package including the flanged stiffener ring of FIG. 1, in accordance with an embodiment described herein;

FIG. 2B is a cross sectional view of the device package of FIG. 2A, taken along line 2-2 of FIG. 2A;

FIG. 4A-1 is a top perspective view of a flanged stiffener ring in accordance with an embodiment described herein;

FIG. 4A-2 is a cross sectional view of the flanged stiffener ring of FIG. 4A-1, taken along line 4A-4A of FIG. 4A-1;

FIG. 4B-1 is a top perspective view of a flanged stiffener ring in accordance with an embodiment described herein;

FIG. 4B-2 is a cross sectional view of the flanged stiffener ring of FIG. 4B-1, taken along line 4B-4B of FIG. 4B-1;

FIG. 5A-1 is a top perspective view of a flanged stiffener ring in accordance with an embodiment described herein;

FIG. 5A-2 is a cross sectional view of the flanged stiffener ring of FIG. 5A-1, taken along line 5A-5A of FIG. 5A;

FIG. 5B-1 is a top perspective view of a flanged stiffener ring in accordance with an embodiment described herein;

FIG. 5B-2 is a cross sectional view of the flanged stiffener ring of FIG. 5B-1, taken along line 5B-5B of FIG. 5B-1;

FIG. 8A is a top perspective view of a flanged stiffener ring in accordance with an embodiment described herein;

FIG. 8B is a cross sectional view of the flanged stiffener ring of FIG. 8A, taken along line 8-8 of FIG. 8A;

FIG. 9 is a top perspective view of a flanged stiffener ring in accordance with an embodiment described herein.

DETAILED DESCRIPTION OF EMBODIMENTS

Figure 3:
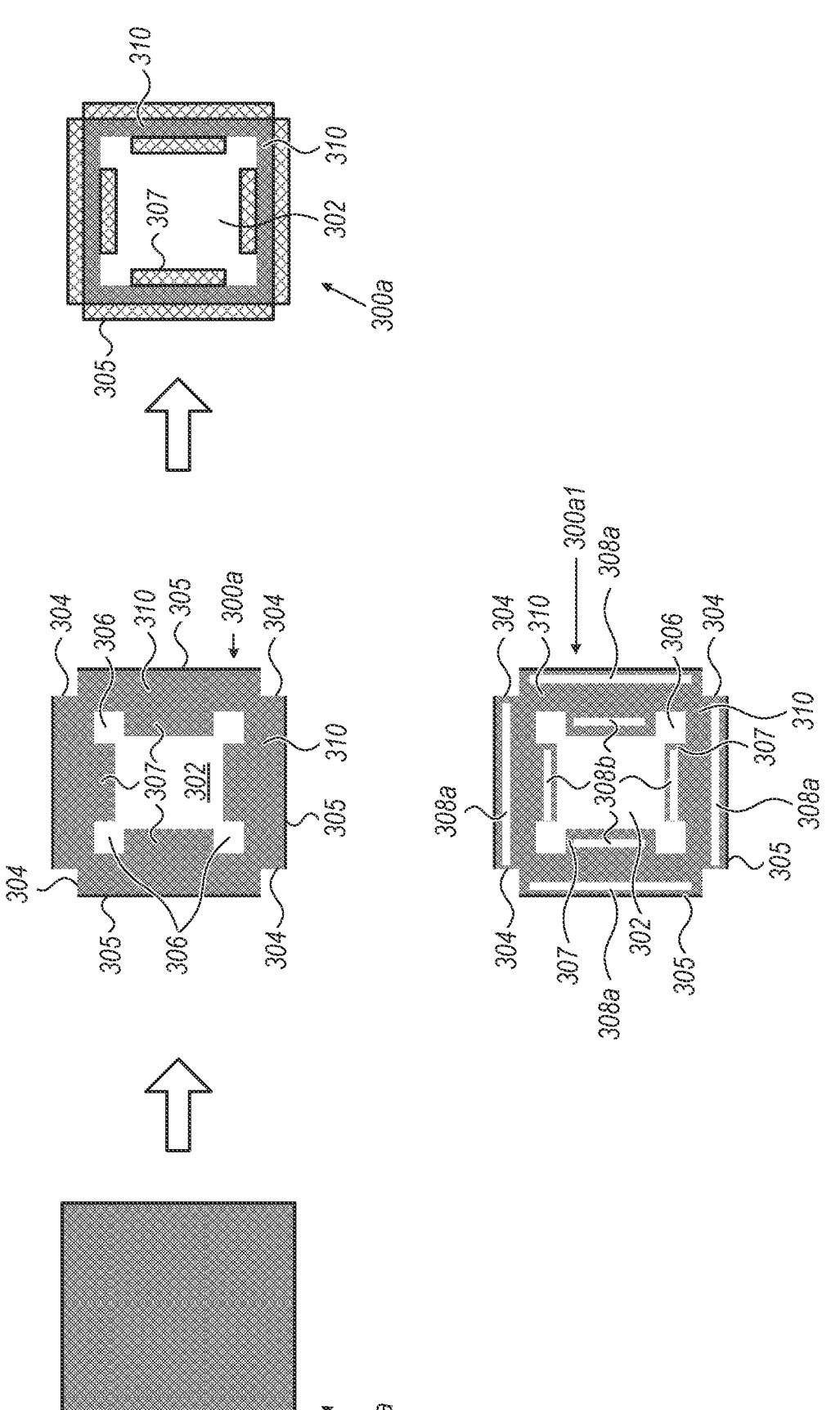
FIG. 3 is a diagram of a manufacturing flow for making flanged stiffener rings in accordance with embodiments described herein.

As the size of device packages increases, the increasing size of these device packages also provides greater chances for substrate warpage, for example, by substrate bowing or bending (but not only), due to coefficient of thermal expansion (CTE) mismatch of die and laminate materials coupled with increased distance to a neutral point in the now-larger package. Warpage, and in particular, increased warpage due to increased device package size, may create significant yield loss in device package production, resulting in losses of expensive dies, e.g., devices, and/or loss of the substrates, which are rejected as defective due to warpage. Also, in some cases, warpage results in increased cycle time for production.

Warpage reduction in these larger packages may include using a thicker substrate, or other package core material. These approaches are expensive in that they require more substrate material, or simply, more expensive materials. Package warpage improvements have also been sought through increases in thickness and/or foot width of stiffener bars and stiffener rings. However, these stiffener bars and stiffener rings add significant weight to the device packages, which is problematic.

The increased overall package weight is a main cause of ball grid array (BGA) reflow defects when mounting the device package to a board, such as a printed circuit board (PCB). This is due to the excess weight crushing ball grid arrays (BGAs) during reflow, causing short circuits in adjacent BGAs. Additionally, the increased weight may prohibit use of the device package in situations and applications with constrained weight limits.

In cases where stiffeners with increased foot width are used, the overall size of the package must be increased to accommodate all of the required devices, connections, connectors and the like. The increased size requires additional materials, including more material for the substrate, resulting in increased costs.

Increasing stiffener size, e.g., thickness, causes additional problems, such as requiring customized heat sinks with pedestals, for the devices of the device package, and also results in reduced head room for fin height, the fin height needed for better heat dissipation.

The present disclosure provides a flanged stiffener ring, which improves package and substrate warpage without having to increase package and substrate size, and is of minimal weight, thus minimizing the overall package weight. This minimal weight results by using the minimal amount of material for a disclosed flanged stiffener ring, by having slots (either partially or completely through the flanged stiffener ring) and or cut away portions, for example, in the flanges, of the flanged stiffener, coupled with the flanged stiffener being formed from thin stocks, such as a thin metal blanks of stainless steel or copper of approximately 1.0 mm in thickness, instead of approximately 2.0 mm in thickness. The resultant flanged stiffener ring is rigid and provides structural integrity, to maintain maximum stiffness (maximum stiffening forces) for the substrate. By minimizing weight, the disclosed flanged stiffener ring may be used in environments with severely constrained weight limits, such as automotive and aerospace applications.

The reduced weight of the flanged stiffener ring provides the ring with a smaller footprint on the substrate of the device package, when compared to the foot prints of the larger conventional stiffeners detailed above. These smaller footprints allow for increased number and/or size of chips, dies, devices and the like which can be part of the device page, as disclosed herein.

The rigidity of the material, e.g., metal, for the flanged stiffener ring, coupled with the shape and design of the disclosed flanged stiffener ring, provides the flanged stiffener ring with sufficient rigidity to counterbalance warpage forces from the substrate. Additionally, the flanged stiffener ring has a smaller footprint where it joins (attaches) to the substrate, when compared to conventional stiffener bars and stiffener rings, such as those used in fully lidded packages.

Using the aforementioned thinner metal blanks results in lower costs, from using less material, and also results in a stiffener ring whose weight is minimized yet sill provides maximum counterbalancing mechanical forces to those caused by substrate warpage. As the material blank for the disclosed flanged stiffener ring is lightweight, production costs are lower, due to less material for the substrate and stiffener ring, and lighter weight material for the stiffener ring, making cutting, punching, bending, and other and forming operations easier, and performed in less time than with thicker blanks. Also, lighter weight materials reduce wear and tear on processing machinery, as the machinery avoids lifting and processing heavier stiffeners and heavier packages. Additional costs are saved, as the blank may be pre-formed prior to entry into a production line with substrates, devices and the like.

The disclosed flanged stiffener ring is also of a cross section, which minimizes contact surface area on the substrate. This minimization of the contact surface area is one aspect of the disclosed flanged stiffener ring, that reduces heat absorption by the flanged stiffener ring, for example, of the heat generated during reflow, retaining more of the reflow heat in the ball grid array (BGA) during reflow. This heat retention in the BGA prevents cold flow, which keeps reflow from completing properly, such that electrical connections of the joints form incompletely or do not form at all, a condition known as "cold" joints.

Figures 1, 5A:
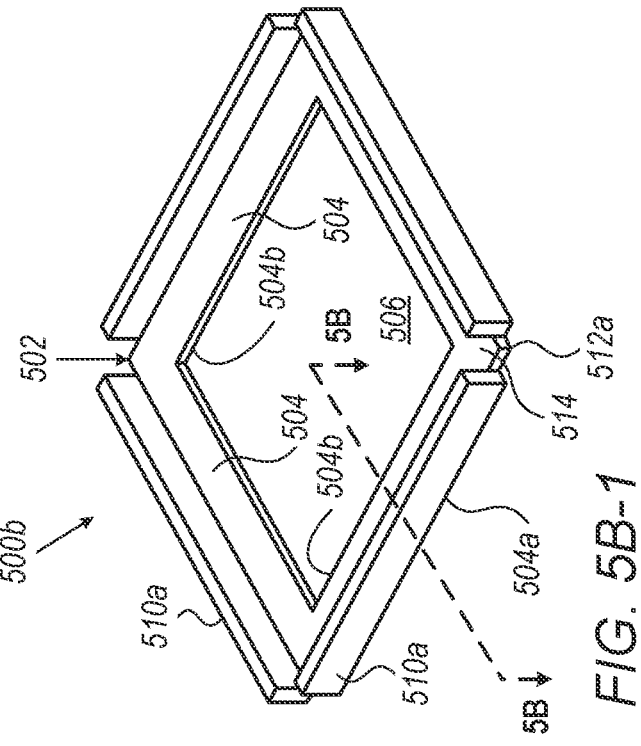
Figures 2, 5A:
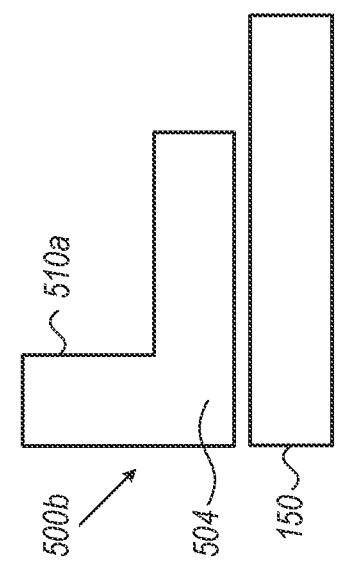

Attention is directed to FIGS. 1, 2A and 2B. FIG. 1 shows an example flanged stiffener ring 100, and in FIG. 2, the flanged stiffener ring 100 is shown in use on a substrate 150, the substrate 150 can also be referred to as a package 200, the substrate 150, of a device package or an electronic device 200, the terms "device package" and "electronic device" used interchangeably herein.

When describing the flanged stiffener ring 100 (as well as all other flanged stiffener rings and substrates 150 and device packages disclosed herein), alone and as part of the device package 200, the terms "upper", "top", "lower", "upward", "downward", "bottom", "under", "lateral", and derivatives thereof, are indicative of a relative direction and merely serve as examples. Other directions and orientations for the device package 200 are also suitable. The "substrate" 150 is also known as a "package substrate", with these terms used interchangeably herein. The substrate 150 when a in a device package or electronic device 200, supports one or more electronic components, such as devices, such as bumped devices, dies and the like.

The flanged stiffener ring 100 is formed of a ring body 102, formed of sides 104, each of the sides 104 extending between an outer edge 104a and an inner edge 104b. The outer edges 104a of each of the sides 104 combine to form an outer ring, and the inner edges 104b of each of the sides 104 combine to form an inner ring. The inner ring forms a perimeter of an aperture 106, which is positioned substantially centrally with respect to the body 102. One or more flanges, for example, flanges 110a (outer), 110b (inner), protrude from one or more of the sides 104 of the ring body 102. For example, the flanges 110a, 110b protrude (extend) from one or both of the outer 104a and/or inner 104b edges of each respective side 104. Alternately, one or more flanges may protrude (extend)from the body intermediate the edges 104a, 104b of any one or more of the sides 104.

While the flanges 110a, 110b shown protrude (extend) in the same direction (e.g., upward) and are oriented at least substantially perpendicular to the plane of the plane of the lower edge of the body 102 (the lower edge of the body formed by the coplanar flat portions 104x of each of the sides 104, as shown for example, in FIG. 2B). The flanges 110a, 110b may also be positioned to protrude in different directions (e.g., one in the upward direction and one in the downward direction), and regardless of protrusion direction, are oriented, for example, at least substantially perpendicular to the plane of the lower edge of the body 102. Examples of flanged stiffener rings 600, 700, 800, 900 having downwardly protruding flanges, are shown, for example, in FIGS. 6A, 7A, 8A and 9, respectively, and described below.

The flanges 110a, 110b, on any one of or both edges 104a, 104b of the respective sides 104 of the body 102, for example, extend laterally along the edges 104a, 104b of the respective sides 104. The outer flanges 110a, for example, terminate at the respective outer corner 112a of the body 102, while the inner flanges 110b extend laterally at least partially along the respective side 104 to have cut-outs 114 or gaps at the inner corners 112b, between adjacent inner flanges 110b. The cut-outs 114 also serve to reduce overall weight of the flanged stiffener ring 100, without reductions in stiffness of the flanged stiffener ring 100. Alternately, the outer flanges 110a may also have cut-outs 114, as shown, for example, by the flanged stiffener rings 400a, 400b, 500b, 600, 700, 800, 900 of FIGS. 4A, 4B, 5B, 6A, 7A. 8A and 9, respectively, and described below.

As shown in FIG. 2B, each side 104 is, for example, of a C-shaped cross section, formed of a flat portion 104x with oppositely disposed rounded portions 104y at the edges 104a, 104b. The flat portions 104x of each side are, for example, coplanar, and form the lower edge of the body 102. Each flat portion 104x is designed to contact the substrate 150, such that the contact surface area of the flanged stiffener ring 100 is minimized. This limited contact surface area additionally reduces heat absorption by the flanged stiffener ring 100, during processes such as reflow, allowing the maximum amount of heat to remain with the ball grid array (BGA) or other device being connected to the substrate 150, and preventing "cold" joints. Alternately, other cross sectional shapes for the sides 104, such as L-shapes and U-shapes, with squared edges 104a, 104b are also permissible.

The flanges 110a, 110b, for example, optionally include slots 116 or other cut-out sections, shown, for example, as rectangular segments on the inner flanges 110b, but could be any suitable shape. The slots 116 reduce the weight of flanged stiffener ring 100, as well as heat absorption, without reductions in stiffness of the flanged stiffener ring 100. The slots 116 may extend partially or completely through the respective flange 110a, 110b.

The flanged stiffener ring 100, for example, is part of a device package 200, with the substrate 150, shown in FIGS. 2A and 2B. The substrate 150, for example, is made of laminate layers, and is known, for example, as an organic substrate. The flanged stiffener ring 100, for example, seats on the substrate 150 at or proximate to the perimeter 152 of the substrate 150, to align with the substrate 150, and, for example, such that the aperture 106 is substantially concentric with, or concentric with, the substrate 150.

The flanged stiffener ring 100 is made of materials, such as metals, including, for example, Copper and stainless steel, as well as composites. The metals or composites are, for example, provided as blanks 300 of approximately 1 mm thick sheets, and formed into the respective flanged stiffener ring 100, by processes shown, for example, in FIG. 3.

Staying in FIG. 3, there is shown an illustration of an example manufacturing flow process for the disclosed flanged stiffener ring 100.

Initially, a stock material of a given thickness, for example, metal, e.g., copper, of approximately 1.0 mm thickness, in the form of a blank 300 is provided. The blank 300 is, for example, shown as rectangular, e.g., square, in shape, and is a single (unitary) piece.

The blank 300 may then be punched, so as to have a central opening or aperture 302, corresponding to the aperture 106 in the flanged stiffener ring 100. L-shaped (e.g., right angled) punches or angled portions 304 at the outer corners of the blank 300 define an outer region 305, from which the outer flanges 110a are created. Rectangular portions 306 (e.g., substantially rectangular), e.g., substantially square or square, formed by punches, proximate to the corners of the central opening 302, define an inner region 307, from which the inner flanges 110b are created, with the punched blank now designated as 300a.

The punched blank 300a, may have slots 308a, 308b punched or otherwise cut into the areas which will be formed into the outer 110a and inner 110b flanges, respectively. This further punched blank is designated as 300al.

Punched blanks 300a as shown, and 300al, may now be further formed, by bending the regions 305, 307, upward or downward, for example, about the respective body regions 310, which are intermediate each of the outer regions 305 and inner regions 307, to form the respective flanges 110a, 110b on the respective sides 104, and the body 102, resulting in the flanged stiffener ring 100. The regions 305 (outer), 307 (inner) are bent, for example, to be substantially perpendicular, or perpendicular to the body region 310, which remains flat (each body region defining a side 104 of the flanged stiffener ring 100). The now completed flanged stiffener ring may then be aligned with a substrate 150, for example, to be concentric therewith, where the sides 104 are at least proximate to the perimeter 152 of the substrate, and/or the outer edges 104a of the sides align with the respective edges 150a of the substrate 150. The flanged stiffener ring 100 is then fastened to the substrate 150 by one or more of adhesives, mechanical fasteners, and other fasteners, such as, for example, SE4450 produced by DuPont, Wilmington, DE USA, EA6900 produced by DOWSIL™ EA6900 Adhesive, both from the Dow Chemical Company of Midland, Michigan USA.

FIGS. 4A-1 (perspective view) and 4A-2 (cross-sectional view shown with the substrate 150), show a flanged stiffener ring 400a, similar to the flanged stiffener ring 100 detailed above, with similar elements thereto numbered in the 400s. The flanged stiffener ring 400a includes a body 402 with sides 404 of U-shaped cross sections, with squared edges 404a, 404b. The flanges 410a, 410b protrude (extend) in the same direction from the body 402.

FIGS. 4B-1 (perspective view) and 4B-2 (cross-sectional view shown with the substrate 150), show a flanged stiffener ring 400b. This flanged stiffener ring 400b is similar to the flanged stiffener ring 400a as shown in FIGS. 4A-1 and 4A-2, except the flanges 410a, 410b include slots 416 extending through the respective flanges 410a, 410b.

FIGS. 5A-1 (perspective view) and 5A-2 (cross-sectional view shown with the substrate 150), show a flanged stiffener ring 500a. The flanged stiffener ring 500a is similar to the flanged stiffener ring 100 detailed above, with similar elements numbered in the 500s, with bodies 502 of L-shaped cross sections, with squared edges 504a, 504b at each of the respective sides 504. The flanges 510b protrude (extend) upward, from the body 502 at the inner edges 504b of the respective sides 504. The inner corners 512b include cut-outs or gaps 514, allowing for reduced weight of the flanged stiffener ring 500a.

Figures 1, 5B:
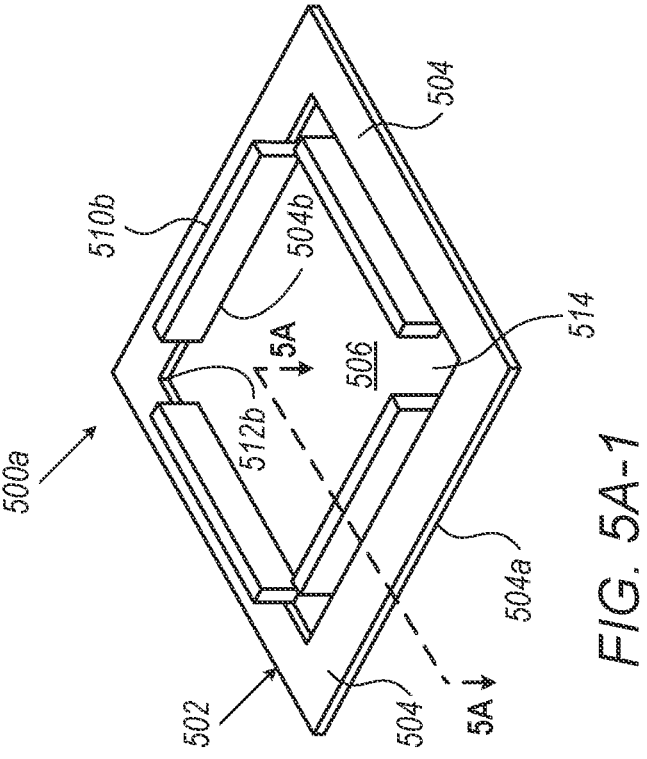
Figures 2, 5B:
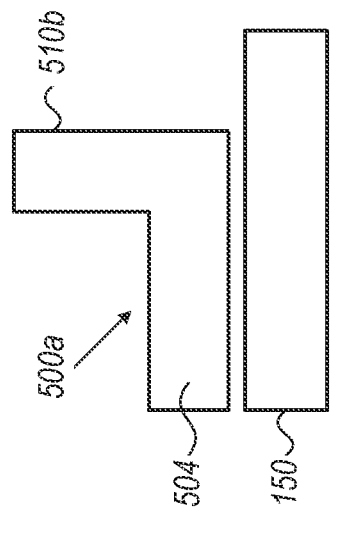

FIGS. 5B-1 (perspective view) and 5B-2 (cross-sectional view shown with the substrate 150), show a flanged stiffener ring 500b. The flanged stiffener ring 500b is similar to the flanged stiffener ring 100, as detailed above, with similar elements numbered in the 500s, with bodies 502 of L-shaped cross sections, with squared edges 504a, 504b (FIG. 5B) at each of the respective sides 504. The flanges 510a protrude (extend) upward, from the body 502 at the outer edges 504a of the respective sides 504. The outer corners 512a include cut-outs or gaps 514, allowing for reduced weight of the flanged stiffener ring 500b.

Figure 6A:
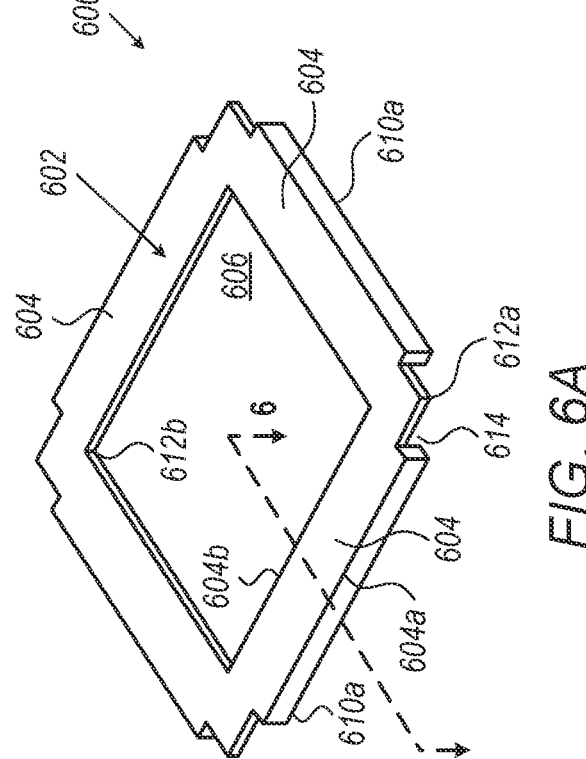
FIG. 6A is a top perspective view of a flanged stiffener ring in accordance with an embodiment described herein.

FIGS. 6A (perspective view) and 6B (cross-sectional view shown with the substrate 150), show a flanged stiffener ring 600, similar to the flanged stiffener ring 100 detailed above, with similar elements numbered in the 600s, with bodies 602 of L-shaped cross sections, with squared edges 604a, 604b at the respective sides 604. The flanges 610a, located at the outer edges 604a of the respective sides 604 of the body 600 protrude (extend) downward from the respective sides 604 (along the edge 150a of the substrate 150), from the body 602. The outer corners 612a include cut-outs or gaps 614, allowing for reduced weight of the flanged stiffener ring 600.

Figure 7A:
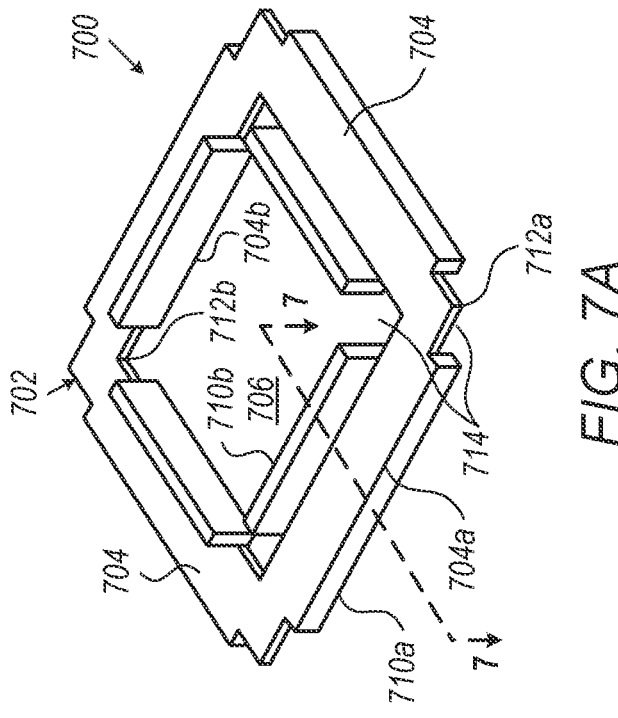
FIG. 7A is a top perspective view of a flanged stiffener ring in accordance with an embodiment described herein.
Figure 7B:
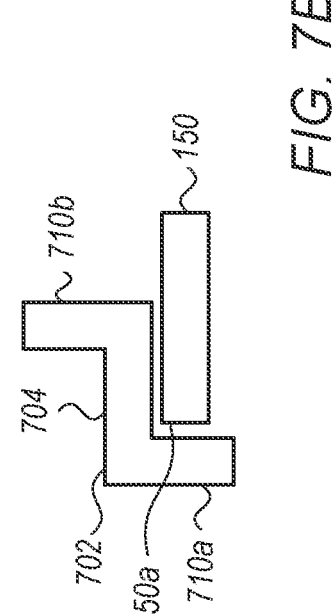
FIG. 7B is a cross sectional view of the flanged stiffener ring of FIG. 7A, taken along line 7-7 of FIG. 7A.

FIGS. 7A (perspective view) and 7B (cross-sectional view), show a flanged stiffener ring 700, similar to the flanged stiffener ring 100 detailed above, with similar elements numbered in the 700s, with bodies 702 of L-shaped cross sections, with squared edges 704a, 704b at the respective sides 704. The outer flanges 710a (located at the outer edges 704a of the respective sides 704 of the body 702) protrude (extend) downward from the respective sides 704 (along the edge 150a of the substrate 150), from the body 702, while the inner flanges 710b (located at the inner edges 704b of the respective sides 704 of the body 702) protrude (extend) upward from the respective side 704. The outer corners 712a include cut-outs or gaps 714, allowing for reduced weight of the flanged stiffener ring 700.

Figure 6B:
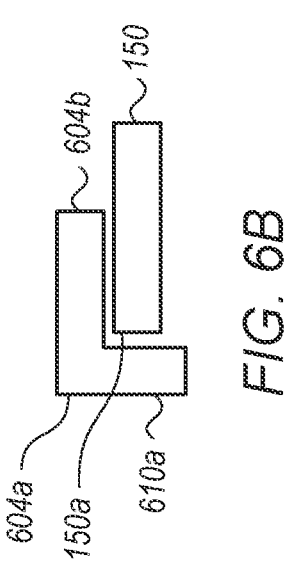
FIG. 6B is a cross sectional view of the flanged stiffener ring of FIG. 6A, taken along line 6-6 of FIG. 6A.

FIGS. 8A (perspective view) and 8B (cross-sectional view shown with the substrate 150), show a flanged stiffener ring 800, similar to the flanged stiffener ring 600, shown in FIGS. 6A and 6B, with similar elements numbered in the 800s. The body 802, for example, on each of the sides 804 includes a tab 820, with a bore 822, for example, of a circular cylindrical shape, extending through each respective tab 820. Pins and other fasteners may be inserted through the bores 822 as part of a heat sink mounting or fixturing directly onto the device package 200.

FIG. 9 shows a flanged stiffener ring 900, similar to the flanged stiffener ring 800, shown in FIGS. 8A and 8B, with similar elements numbered in the 900s. The body 902, for example, on each of the corners 918 includes a tab 920, with a bore 922, of a circular cylindrical shape, extending through each respective tab 920. Pins and other fasteners may be inserted through the bores 922 as part of a heat sink mounting or fixturing directly onto the device package.

Figure 10:
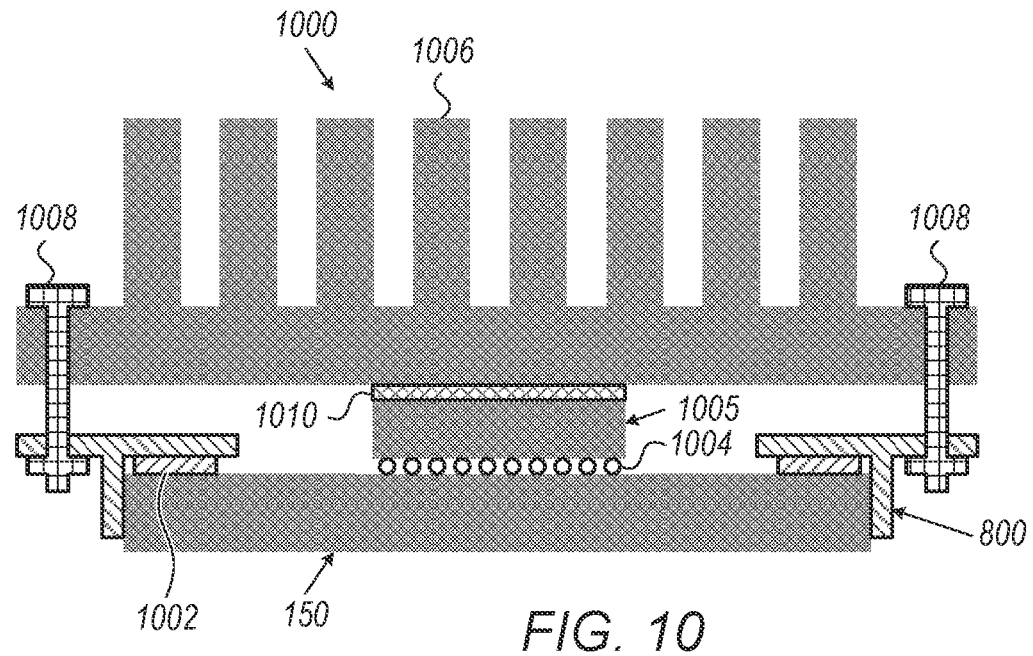
FIGS. 10 and 11 are side views of device packages including a flanged stiffener ring, in accordance with embodiments described herein.

FIG. 10 is diagram of a direct heat sink attachment in a device package or electronic device 1000 using the fixture tabs 820 and the flanged stiffener ring 800, shown in FIGS. 8A and 8B and described above. The flanged stiffener ring 800 at its body 802 formed by the respective sides 804, is such that the sides 804 attach to the substrate 150, along or proximate to the perimeter 152 of the substrate 150, via an adhesive layer 1002. The substrate 150, for example, has bumps 1004 of a bumped device 1005, die or device mounted thereon. A heat sink 1006 extends over the bumped device 1005, die or other device, and attaches to the flanged stiffener ring 800 via fasteners 1008. A layer 1010 of thermal interface material (e.g., TIM1.5) is disposed on the lower side of the heat sink 1006 and the upper side of the bumped device 1005, die or device.

The flanged stiffener ring 900 may be used to attach the heat sink 1006 to a device package in a similar manner to that of the flanged stiffener member 800.

Figure 11:
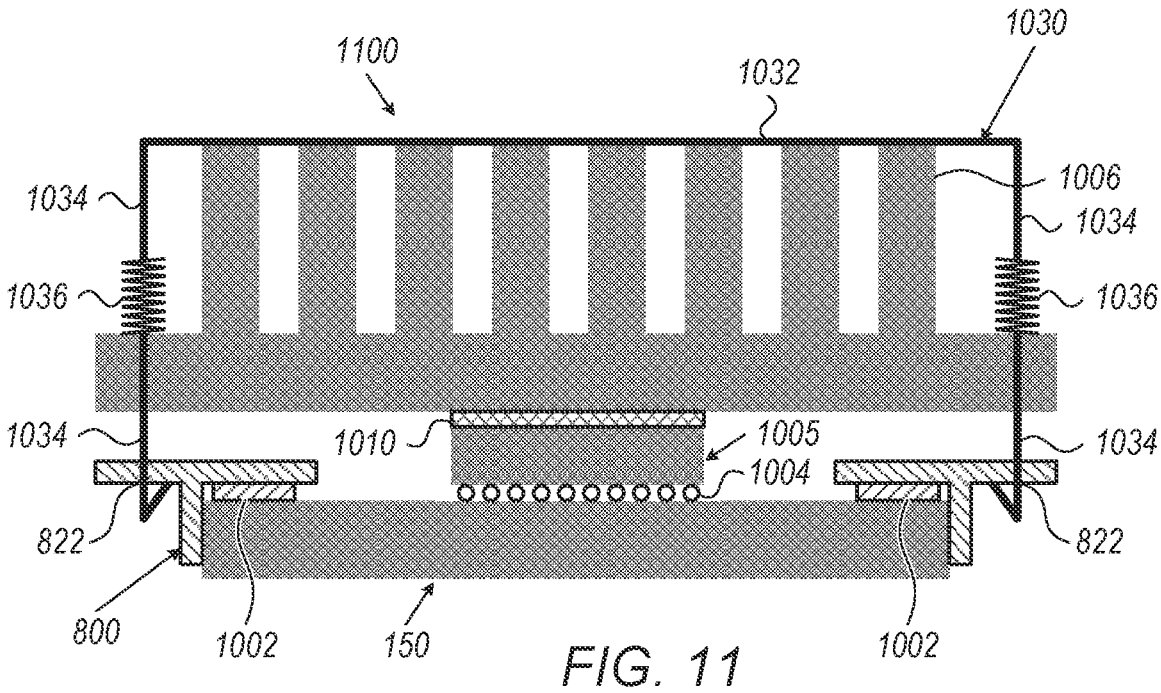

FIG. 11 is diagram of a direct heat sink attachment in a device package or electronic device 1100 using the fixture tabs 820 and the flanged stiffener ring 800, shown in FIGS. 8A and 8B and described above. The flanged stiffener ring 800, i.e., the respective sides 804 forming the body 802, attaches to the substrate 150, along the perimeter 152 of the substrate 150, and via an adhesive layer 1002. The substrate 150, for example, has bumps 1004 of a bumped device 1005, die or other device, mounted thereon. A heat sink 1006 extends over the bumped device 1005, die or other device, and attaches to the flanged stiffener ring 800. A layer 1010 of thermal interface material (e.g., TIM1.5) is disposed on the lower side of the heat sink 1006 and the upper side of the bumped device 1005, die or other device. A spring loaded clamp 1030, formed of a center piece 1032 and lateral wires 1034, with intermediate springs or spring-based segments 1036. The lateral wires 1034 extend through the bores 822 of the tabs 820, to hold the clamp 1030, such that it puts downward pressure on the heat sink 1006. The springs 1036 serve, for example, as shock absorbers, keeping the clamp 1030 in place on the package 1100.

The flanged stiffener ring 900 may be used to attach the heat sink 1006 to a device package using the spring loaded clamp 1030 in a similar manner to that of the flanged stiffener ring 800.

Although the embodiments described herein mainly address device packages, the methods and systems described herein can also be used in other applications, such as in Ball Grid Arrays (BGA), standard 2D Flip Chip BGA products, Multi-Chip Module (MCM) Packages, 2.5D packages, and 3D Semiconductor Packages.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic device, comprising:
a substrate;
electronic components disposed on the substrate; and
a stiffener, comprising
   a ring body of a plurality of sides, each side extending between an outer edge and an inner edge, the inner edges forming an aperture in the ring body, the body configured to align with a perimeter of the substrate, and at least one flange protruding from at least one side of the ring body in a direction away from the substrate, the at least one flange extending along at least part of the at least one side.

2. The electronic device of claim 1, wherein the ring body and the at least one flange are formed from a single blank.

3. The electronic device of claim 2, wherein the single blank is of metal or of a composite material.

4. The electronic device of claim 3, wherein the metal includes copper or stainless steel.

5. The electronic device of claim 1, wherein the ring body formed by the plurality of the sides is rectangular in shape.

6. The electronic device of claim 1, wherein each side of the plurality of sides of the ring body is C-shaped in cross section.

7. The electronic device of claim 1, wherein the at least one flange protruding from the at least one side of the ring body protrudes from at least one of the outer edge or the inner edge.

8. The electronic device of claim 7, wherein the at least one flange includes a plurality of flanges, a first flange protruding from the outer edge and a second flange protruding from the inner edge.

9. The electronic device of claim 7, wherein the at least one flange includes a plurality of flanges, a first flange protruding from the outer edge in a first direction and a second flange protruding from the inner edge in a second direction, different from the first direction.

10. The electronic device of claim 9, wherein the first direction is opposite the second direction.

11. The electronic device of claim 1, wherein the at least one flange has one or more openings formed therein.

12. The electronic device of claim 1, wherein the ring body includes tabs for receiving at least one fastener, the tabs positioned: 1) along at least two oppositely disposed sides of the ring body, or 2) at least at oppositely disposed corners of the ring body.

13. The electronic device of claim 12, additionally comprising: a heat sink for attaching to the ring body via each of the at least one fastener.

14. The electronic device of claim 12, wherein each of the at least one fasteners include a spring-based segment.

15. An electronic device, comprising:
a substrate;
electronic components disposed on the substrate; and
a stiffener, comprising
   a ring body of a plurality of sides, each side extending between an outer edge and an inner edge, the inner edges forming an aperture in the ring body, the body configured to align with a perimeter of the substrate, and
   a plurality of flanges, including at least (i) a first flange protruding from the ring body in a first direction and (ii) a second flange protruding from the ring body in a second direction, different from the first direction.

* * * * *